(12) United States Patent             (10) Patent No.: US 10,892,780 B2
Yu                                    (45) Date of Patent:     Jan. 12, 2021

(54) POLAR POLAR CODE ENCODING AND DECODING METHOD AND APPARATUS (71) Applicant: HUAWEI TECHNOLOGIES CO., LTD., Guangdong (CN)

(72) Inventor: Rongdao Yu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/173,063

(22) Filed: Oct. 29, 2018

(65) Prior Publication Data

US 2019/0068225 A1    Feb. 28, 2019

Related U.S. Application Data

(63) Continuation of application No. PCT/CN2016/080839, filed on Apr. 29, 2016.

(51) Int. Cl.
*H03M 13/13*    (2006.01)
*H03M 13/09*    (2006.01)
(Continued)

(52) U.S. Cl.
CPC ........... *H03M 13/13* (2013.01); *H03M 13/09* (2013.01); *H03M 13/2957* (2013.01);
(Continued)

(58) Field of Classification Search
CPC .. H03M 13/13; H03M 13/09; H03M 13/2957; H04L 1/0041; H04L 1/0061; H04B 17/336
See application file for complete search history.

(56) References Cited

U.S. PATENT DOCUMENTS

2007/0297451 A1   12/2007  Kim et al.
2009/0028253 A1*   1/2009  Wu ............... H04L 27/2608
                                                375/260
(Continued)

FOREIGN PATENT DOCUMENTS

CN    101644254 B    6/2012
CN    103220001 A    7/2013
(Continued)

OTHER PUBLICATIONS

Murata et al., "CRC Design for List Decoding of Polar Code," The Institute of Electronics, Information and Communication Engineers (IEICE), IEICE Technical Report, Jan. 2016, 5 pages (with English abstract).

(Continued)

*Primary Examiner* — Guy J Lamarre
(74) *Attorney, Agent, or Firm* — Fish & Richardson P.C.

(57) ABSTRACT

Embodiments of the present invention disclose a polar polar code encoding and decoding method and an apparatus. The decoding method may include: obtaining a polar polar code a code length N of the polar polar; determining a survivor path quantity L of the polar polar code according to the code length N of the polar polar code and a signal-to-noise ratio SNR for receiving the polar polar code, where L is a positive integer; and performing successive cancellation list SCL decoding on the polar polar code according to the survivor path quantity L, to obtain L survivor paths, and checking at least one of the L survivor paths, to obtain a decoding result of the polar polar code. The present invention can address a prior-art disadvantage that decoding is rather complex because of a fixed survivor path quantity L for polar code decoding.

20 Claims, 6 Drawing Sheets

(51) Int. Cl.
*H03M 13/35* (2006.01)
*H04B 17/336* (2015.01)
*H03M 13/29* (2006.01)
*H04L 1/00* (2006.01)

(52) U.S. Cl.
CPC ........ *H03M 13/353* (2013.01); *H04B 17/336* (2015.01); *H04L 1/0041* (2013.01); *H04L 1/0061* (2013.01)

(56) References Cited

U.S. PATENT DOCUMENTS

| | | | |
|---|---|---|---|
| 2014/0019820 A1* | 1/2014 | Vardy | H03M 13/13 714/752 |
| 2014/0173376 A1 | 6/2014 | Jeong et al. | |
| 2014/0365842 A1* | 12/2014 | Li | H03M 13/1111 714/752 |
| 2015/0222295 A1 | 8/2015 | Li et al. | |
| 2015/0295593 A1 | 10/2015 | Trifonov et al. | |
| 2016/0013810 A1 | 1/2016 | Gross et al. | |
| 2016/0079999 A1 | 3/2016 | Shen et al. | |
| 2017/0187396 A1 | 6/2017 | Jeong et al. | |
| 2017/0264394 A1* | 9/2017 | Shen | H03M 13/27 |

FOREIGN PATENT DOCUMENTS

| | | |
|---|---|---|
| CN | 103780329 A | 5/2014 |
| CN | 104124979 A | 10/2014 |
| CN | 105337696 A | 2/2016 |
| CN | 206190494 U | 5/2017 |
| CN | 106837754 A | 6/2017 |
| DE | 10158343 A1 | 8/2002 |
| EA | 024910 B1 | 11/2016 |
| EP | 2802080 A1 | 11/2014 |
| KR | 20140077492 A | 6/2014 |
| KR | 20140077596 A | 6/2014 |
| RU | 2091613 C1 | 9/1997 |
| RU | 2215369 C1 | 10/2003 |
| RU | 2014110139 A | 9/2015 |
| RU | 2571587 C2 | 12/2015 |
| WO | 2016114689 A1 | 7/2016 |

OTHER PUBLICATIONS

Office action issued in Japanese Application No. 2018-556801 dated Jan. 14, 2020, 6 pages (with English translation).
Office Action issued in Russian Application No. 2018141820dated Aug. 22, 2019, 11 pages (with English translation).
Office Action issued in Korean Application No. 10-2018-7034224 dated Jun. 21, 2019, 6 pages (with English translation).
Maja Loncar et al. Estimating the list size for BEAST-APP decoding, ISIT 2005, Sep. 2005. 6 pages. XP010845720.
Communication Pursuant to Rule 164(1) EPC issued in European Application No. 16899888.8 dated Mar. 8, 2019, 13 pages.
Sarkis et al., "Increasing the Speed of Polar List Decoders" 2014 IEEE workshop on signal processing systems, Oct. 20-22, 2014, 6 pages.
Extended European Search Report issued in application No. 16899888.8, dated Jun. 21, 2019, 12 pages.
International Search Report and Written Opinion issued in International Application No. PCT/CN2016/080839 dated Jan. 25, 2017, 17 pages.
Office Action issued in Korean Application No. 2018-7034224 dated Aug. 4, 2020, 3 pages (with English translation).
Office Action issued in Russian Application No. 2020107536/07(012146) dated Sep. 10, 2020, 16 pages (with English translation).
Huawei, "Overview of Polar Codes," 3GPP TSG RAN WG1 Meeting #84bis, R1-162161, Busan, Korea, Apr. 11-15, 2016, 7 pages.
Intel Corporation, "Channel coding for new radio interface," 3GPP TSG RAN WG1 Meeting #84bis, R1-162387, Busan, South Korea, Apr. 11-15, 2016, 4 pages.
EPO Communication pursuant to Article 94(3) EPC issued in European Application No. 16899888.8 on Sep. 25, 2020, 7 pages.

* cited by examiner

POLAR POLAR CODE ENCODING AND DECODING METHOD AND APPARATUS

CROSS-REFERENCE TO RELATED APPLICATIONS

This application is a continuation of International Application No. PCT/CN2016/080839, filed on Apr. 29, 2016, the disclosure of which is hereby incorporated by reference in its entirety.

TECHNICAL FIELD

The present invention relates to the field of communications technologies, and in particular, to a polar polar code encoding and decoding method and an apparatus.

BACKGROUND

In a communications transmission system, channel coding is usually performed on to-be-transmitted information to improve data transmission reliability and ensure communication quality. In a channel coding technology, an extra check bit is added to an information sequence sent by a transmit end, and a decoding technology is used at a receive end to correct, with a relatively high probability, an error generated in a transmission process, so that the sent information sequence is received correctly.

To reduce an error probability in a transmission process and improve wireless communications link utilization, Erdal Arikanfirst put forward a concept of channel polarization at the International Symposium on Information Theory ISIT in 2008. Based on the theory, he proposed a polar code (Polar Code), a first known channel coding method that can theoretically achieve a channel transmission capacity limit (also known as a Shannon limit) and that has a low complexity. Through channel polarization (channel polarization), a communications channel may be polarized into a pure noisy bit-channel (pure noisy bit-channel) and a noiseless bit-channel (noiseless bit-channel). A polar polar code allows information to be transmitted by using only the noiseless bit-channel, so that a maximum transmission rate of channel transmission can be achieved.

In the prior art, a polar polar code is mainly decoded in the following manners: successive cancellation (Successive Cancellation, SC) decoding and enhanced SC decoding that is obtained based on an improved SC decoding algorithm. The enhanced SC decoding further includes successive cancellation list (Successive Cancellation List, SCL) decoding, successive cancellation stack (Successive Cancellation Stack, SCS) decoding, successive cancellation hybrid (Successive Cancellation Hybrid, SCH) decoding, and the like. However, performance of the conventional SC decoding algorithm and the enhanced SC decoding algorithm are not desirable, and both algorithms have disadvantages.

For example, a polar polar code whose code length is N is represented as $u^N=(u_1, u_2, \ldots, u_N)$ by using a binary row vector, and may be corresponding to a binary decoding code tree of N layers. SC decoding can be described as a process of searching for a path on the code tree.

Figure 1:
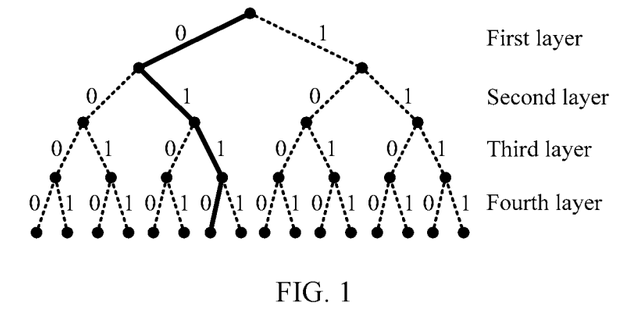
FIG. 1 is a schematic diagram of a code tree of polar code SC decoding.

FIG. 1 shows a simple example in which N=4. SC decoding starts from a root node and gradually extends on a code tree. Each time, a path with a larger probability value is chosen from two candidate paths (one is corresponding to $t_i=0$, and the other is corresponding to $u_i=1$), and next-layer path extension is performed based on that path. FIG. 1 shows a code tree of a polar polar code whose code length N is 4. A black solid line in the figure indicates a path obtained through successive cancellation decoding, and a corresponding bit estimation sequence is (0110). Practice proves that the SC decoding algorithm has good performance when the code length is relatively long, but has undesirable performance when the code length is relatively short.

Figure 2:
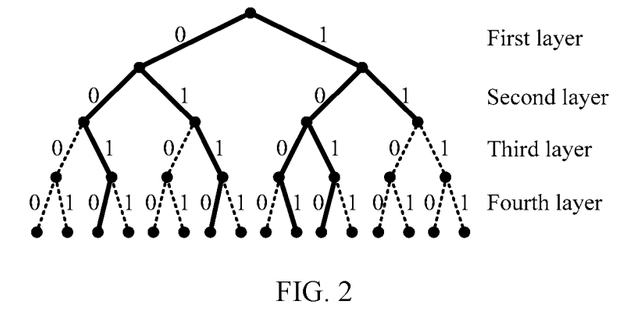
FIG. 2 is a schematic diagram of a code tree of polar code SCL decoding.

As improved SC decoding, the SCL decoding allows reservation of L survivor paths, so as to expand a search range and reduce a probability of deviation from a correct path in a search process. FIG. 2 shows a code tree of a polar polar code whose code length N is 4. A black solid line in the figure indicates a group of search paths of the SCL decoding when a survivor path quantity L is 4, and a finally obtained bit estimation sequence set is (0010), (0110), (1001), and (1010). During the SCL decoding, all survivor paths and reliability metric values corresponding to the survivor paths are stored in a list, and all the survivor paths in the list are extended simultaneously. Therefore, after each extension, a quantity of survivor paths in the list is doubled. Some survivor paths with smaller reliability metric values are discarded to ensure that a quantity of survivor paths is always less than or equal to half of that in the list. When the decoding ends, a path with a largest reliability metric value is found from the list, and a bit estimation sequence corresponding to the path is a decoding result. To obtain good performance, a relatively large searching width needs to be set, that is, largest survivor path quantities L allowed by all layers of the code tree are set to a same value that is relatively large. The value is usually set to 32. However, a relatively large value greatly increases decoding complexity and energy consumption.

SUMMARY

Embodiments of the present invention provide a polar polar code encoding and decoding method and an apparatus, and resolve a prior-art disadvantage that decoding is rather complex because of an unchanged survivor path quantity L for polar polar code decoding.

According to a first aspect, an embodiment of the present invention provides a polar polar code decoding method, including: receiving, by a receive end, a polar polar code and indication information that are sent by a transmit end, where the indication information indicates that a length of the polar polar code is N; determining a survivor path quantity L of the polar code according to the code length N of the polar polar code and a signal-to-noise ratio SNR (Signal to Noise Ratio) for receiving the polar polar code, where L is a positive integer; and performing successive cancellation list SCL decoding on the polar polar code according to the survivor path quantity L, to obtain L survivor paths, and checking at least one of the obtained L survivor paths, to obtain a decoding result of the polar polar code. According to this method, the survivor path quantity L for polar polar code decoding is adaptively chosen according to the code length of the polar polar code and the signal-to-noise ratio for receiving the polar polar code. In this way, a relatively small value of the survivor paths can be chosen without affecting performance. This reduces system complexity, and addresses a prior-art disadvantage that decoding may be rather complex because polar polar code decoding is performed only according to a fixed survivor path quantity. Optionally, the indication information that indicates the length of the polar polar code is N may include a length K of an information sequence X that has not been encoded, a bit rate K/N, and the like.

With reference to the first aspect, in a first possible implementation, a specific implementation of the determining, by the receive end, a survivor path quantity L of the polar code according to the code length N of the polar code and a signal-to-noise ratio SNR for receiving the polar code is: determining, by the receive end according to a pre-stored survivor path quantity mapping relationship between the signal-to-noise ratio SNR, the code length N of the polar code, and the survivor path quantity L, the survivor path quantity L corresponding to the polar polar code, where in the survivor path quantity mapping relationship, a value of L corresponding to a polar code with a larger signal-to-noise ratio SNR for receiving the polar polar code is less than or equal to a value of L corresponding to a polar code with a smaller signal-to-noise ratio SNR for receiving the polar polar code, and a value of L corresponding to a polar code with a longer code length is greater than or equal to a value of L corresponding to a polar code with a shorter code length. According to this method, the receive end adaptively adjusts the value of L according to the mapping relationship between the signal-to-noise ratio for receiving the polar polar code, the code length of the polar code, and the survivor path quantity, thereby achieving an objective of setting the value of L according to a requirement.

With reference to the first aspect or the first possible implementation of the first aspect, in a second possible implementation, a specific implementation of the checking, by the receive end, at least one of the L survivor paths is: performing, by the receive end, a CRC (Cyclic Redundancy Check, cyclic redundancy check) check on the at least one of the L survivor paths. In this method, polar code transmission correctness is ensured by using the CRC check. If an error occurs during transmission, correction can be performed by using CRC, so that the polar code decoding is more accurate. Optionally, the receive end may alternatively check the at least one of the L survivor paths by using another correction algorithm.

With reference to the second possible implementation of the first aspect, in a third possible implementation, a specific implementation of the performing, by the receive end, a cyclic redundancy CRC check on the at least one of the L survivor paths is:

performing, by the receive end, the CRC check on a survivor path with a largest probability value in the L survivor paths; and if the check succeeds, using the survivor path with the largest probability value as the decoding result of the polar code. According to this method, the CRC check is performed on the survivor path with the largest probability value, and if the check succeeds, it can be determined that the survivor path is a correct decoding result. Therefore, it is unnecessary to check a plurality of survivor paths with relatively small probability values, avoiding excessive energy consumption for the check.

With reference to the third possible implementation of the first aspect, in a fourth possible implementation, after the performing, by the receive end, the CRC check on a survivor path with a largest probability value in the L survivor paths, the method includes: if the check fails, notifying the transmit end to perform retransmission; or if the check fails, increasing a value of L within a threshold range of L, and performing SCL decoding on the polar code according to an increased value of L, to obtain the decoding result of the polar polar code. According to this method, if the CRC check fails on the survivor path with the largest probability value, it indicates that an error or a fault may occur during the decoding, and the transmit end needs to be notified to perform replacement or the value of L needs to be increased (to obtain some discarded paths), so as to improve a probability of finally obtaining a correct decoding result of the polar code.

With reference to the second possible implementation of the first aspect, in a fifth possible implementation, a specific implementation of the performing, by the receive end, a cyclic redundancy CRC check on the at least one of the L survivor paths is:

performing, by the receive end, the cyclic redundancy CRC check on w survivor paths in the L survivor paths, where w is an integer greater than 1 and less than or equal to L; and if the check succeeds on a survivor path in the w survivor paths, using, as the decoding result of the polar code, a survivor path with a largest probability value in the survivor path on which the check succeeds. According to this method, the CRC check may be performed on a plurality of survivor paths in the L survivor paths or even on the L survivor paths. Although checking costs are relatively high, a probability of finally obtaining a correct decoding result of the polar code can be greatly increased because more objects are checked.

With reference to the fifth possible implementation of the first aspect, in a sixth possible implementation, after the performing a cyclic redundancy CRC check on the at least one of the L survivor paths, the method further includes: if the check succeeds on none of the w survivor paths, notifying the transmit end to perform retransmission; or if the check succeeds on none of the w survivor paths, increasing a value of L within a threshold range of L, and performing SCL decoding on the polar code according to an increased value of L, to obtain the decoding result of the polar code. According to this method, if the CRC check fails on a plurality of survivor paths in the L survivor paths, it indicates that an error or a fault may occur during the decoding, and the transmit end needs to be notified to perform replacement or the value of L needs to be increased (to obtain some discarded paths). It can be understood that, the value of L needs to be increased within the threshold range of L, and if the check has been performed on the L survivor paths, the value of L cannot be increased. In this case, the only way is to notify the transmit end to perform retransmission. Both manners are intended to increase the probability of obtaining a correct decoding result of the polar code.

With reference to the fourth possible implementation of the first aspect, or with reference to the sixth possible implementation of the first aspect, in a seventh possible implementation, a specific implementation of the increasing a value of L is: increasing the value of L by u, where u is a positive integer, or multiplying L by v, where v is greater than 1. According to this method, the value of L may be increased in various ways. The value of L may be increased exponentially, or may be increased one by one or multiple by multiple. This is not specifically limited in this method.

According to a second aspect, an embodiment of the present invention provides a polar polar code encoding method, and the method may include:

receiving, by a transmit end, a target information sequence, where a length of the target information sequence is K;

determining, according to the length K, a cyclic redundancy check CRC length M for the target information sequence;

adding an M-length CRC check code to the target information sequence, and performing polar encoding on an information sequence obtained after the check code is added, to obtain an N-length polar code; and sending, to a receive end, the polar code and indication information that indicates a length of the polar code is N.

In this embodiment of the present invention, the CRC check code length M is adaptively determined at the transmit end according to the length K of the to-be-transmitted target information sequence. This avoids a problem that the encoding is excessively complex or excessively simple because the value of M of the CRC check code is too large or too small in some cases, so that performance of the polar code encoding is improved.

With reference to the second aspect, in a first possible implementation, the determining, according to the length K, a cyclic redundancy check CRC length M for the target information sequence includes:

determining, according to a pre-stored check code mapping relationship between the length K of the information sequence and the CRC check code length M, the CRC check code length M corresponding to the target information sequence, where in the check code mapping relationship, a CRC check code length M corresponding to an information sequence with a longer length K is greater than or equal to a CRC check code length M corresponding to an information sequence with a shorter length K.

According to a third aspect, an embodiment of the present invention provides a decoder, and the decoder may include:

a decoding receiving module, configured to receive a polar polar code and indication information that are sent by a transmit end, where the indication information indicates that a length of the polar code is N;

a decoding determining module, configured to determine a survivor path quantity L of the polar code according to the code length N of the polar code and a signal-to-noise ratio SNR for receiving the polar code, where L is a positive integer; and a decoding module, configured to: perform successive cancellation list SCL decoding on the polar code according to the survivor path quantity L, to obtain L survivor paths; and check at least one of the L survivor paths, to obtain a decoding result of the polar code.

With reference to the third aspect, in a first possible implementation, the determining module is specifically configured to:

determine, according to a pre-stored survivor path quantity mapping relationship between the signal-to-noise ratio SNR, the code length N of the polar code, and the survivor path quantity L, the survivor path quantity L corresponding to the polar code, where in the survivor path quantity mapping relationship, a value of L corresponding to a polar code with a larger signal-to-noise ratio SNR for receiving the polar polar code is less than or equal to a value of L corresponding to a polar code with a smaller signal-to-noise ratio SNR for receiving the polar polar code, and a value of L corresponding to a polar code with a longer code length is greater than or equal to a value of L corresponding to a polar code with a shorter code length.

With reference to the third aspect, or with reference to the first possible implementation of the third aspect, in a second possible implementation, the decoding module is specifically configured to:

perform a cyclic redundancy CRC check on the at least one of the L survivor paths.

With reference to the second possible implementation of the third aspect, in a third possible implementation, the decoding module includes:

a first checking unit, configured to perform the CRC check on a survivor path with a largest probability value in the L survivor paths; and a first decoding unit, configured to: if the check succeeds, use the survivor path with the largest probability value as the decoding result of the polar code.

With reference to the third possible implementation of the third aspect, in a fourth possible implementation, the decoding module further includes:

a second decoding unit, configured to: if the check fails, increase a value of L within a threshold range of L, and perform SCL decoding on the polar code according to an increased value of L, to obtain the decoding result of the polar code.

With reference to the second possible implementation of the third aspect, in a fifth possible implementation, the decoding module includes:

a second checking unit, configured to perform the cyclic redundancy CRC check on w survivor paths in the L survivor paths, where w is an integer greater than 1 and less than or equal to L; and a third decoding unit, configured to: if the check succeeds on a survivor path in the w survivor paths, use, as the decoding result of the polar code, a survivor path with a largest probability value in the survivor path on which the check succeeds.

With reference to the fifth possible implementation of the third aspect, in a sixth possible implementation, the decoding module further includes:

a fourth decoding unit, configured to: if the check succeeds on none of the w survivor paths, increase a value of L within a threshold range of L, and perform SCL decoding on the polar code according to an increased value of L, to obtain the decoding result of the polar code.

With reference to the fourth possible implementation of the third aspect, or with reference to the sixth possible implementation of the third aspect, in a seventh possible implementation, that the second decoding unit or the fourth decoding unit increases a value of L is specifically:

increasing the value of L by u, where u is a positive integer, or multiplying L by v, where v is greater than 1.

According to a fourth aspect, an embodiment of the present invention provides an encoder, and the encoder may include:

an encoding receiving module, configured to receive a target information sequence, where a length of the target information sequence is K;

an encoding determining module, configured to determine, according to the length K, a cyclic redundancy check CRC length M for the target information sequence;

an encoding module, configured to add an M-length CRC check code to the target information sequence, and perform polar encoding on an information sequence obtained after the check code is added, to obtain an N-length polar code; and a sending module, configured to send, to a receive end, the polar code and indication information that indicates a length of the polar code is N.

With reference to the fourth aspect, in a first possible implementation, the encoding determining module is specifically configured to:

determine, according to a pre-stored check code mapping relationship between the length K of the information sequence and the CRC check code length M, the CRC check code length M corresponding to the target information sequence, where in the check code mapping relationship, a CRC check code length M corresponding to an information sequence with a longer length K is greater than or equal to a CRC check code length M corresponding to an information sequence with a shorter length K.

In the embodiments of the present invention, the receive end receives the polar polar code and the indication information that are sent by the transmit end, where the indication information indicates that the length of the polar code is N; determines the survivor path quantity L of the polar code according to the code length N of the polar code and the signal-to-noise ratio SNR for receiving the polar code; performs successive cancellation list SCL decoding on the polar code according to the survivor path quantity L, to obtain the L survivor paths; and finally, checks the at least one of the L survivor paths, to obtain the decoding result of the polar code. That is, according to the polar code decoding method provided in the present invention, the survivor path quantity L for polar code decoding is adaptively chosen according to the code length of the polar code and the signal-to-noise ratio for receiving the polar polar code. In this way, a relatively small value of the survivor paths can be chosen without affecting performance. This reduces system complexity, and addresses a prior-art disadvantage that decoding may be rather complex because polar code decoding is performed only according to a fixed survivor path quantity.

BRIEF DESCRIPTION OF DRAWINGS

To describe the technical solutions in the embodiments of the present invention or in the prior art more clearly, the following briefly describes the accompanying drawings required for describing the embodiments or the prior art. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

The following clearly and completely describes the technical solutions in the embodiments of the present invention with reference to the accompanying drawings in the embodiments of the present invention. Apparently, the described embodiments are merely some but not all of the embodiments of the present invention. All other embodiments obtained by a person of ordinary skill in the art based on the embodiments of the present invention without creative efforts shall fall within the protection scope of the present invention.

The technical solutions of the embodiments of the present invention may be applied to various communications systems, such as a Global System for Mobile Communications (Global System for Mobile Communications, GSM) system, a Code Division Multiple Access (Code Division Multiple Access, CDMA) system, a Wideband Code Division Multiple Access (Wideband Code Division Multiple Access, WCDMA) system, a general packet radio service (General Packet Radio Service, GPRS), a Long Term Evolution (Long Term Evolution, LTE) system, an LTE frequency division duplex (Frequency Division Duplex, FDD) system, an LTE time division duplex (Time Division Duplex, TDD), and a Universal Mobile Telecommunications System (Universal Mobile Telecommunications System, UMTS). Therefore, the following description is not limited to a specific communications system. Information or data encoded by using a Turbo code or an LDPC code by a base station or a terminal in the foregoing systems may be encoded by using a polar code in the embodiments of the present invention.

It should be further understood that, the base station may be a base transceiver station (Base Transceiver Station, BTS) in GSM or CDMA, or may be a NodeB (NodeB) in WCDMA, or may be an evolved NodeB (Evolved Node B, eNB or eNodeB) in LTE, or a base station device on a future 5G network, or the like. This is not limited in the present invention.

The terminal may be a cellular phone, a cordless phone, a smartphone, a Session Initiation Protocol (Session Initiation Protocol, SIP) phone, a wireless local loop (Wireless Local Loop, WLL) station, a tablet computer, a media player, a smart TV, a smart band, a smart wearable device, an MP3 (Moving Picture Experts Group Audio Layer III, Moving Picture Experts Group Audio Layer 3) player, an MP4 (Moving Picture Experts Group Audio Layer IV, Moving Picture Experts Group Audio Layer 3) player, a personal digital assistant (Personal Digital Assistant, PDA), a handheld device with a wireless communications function, a computing device, another processing device connected to a wireless modem, an in-vehicle device, a terminal device on a future 5G network, or the like. The foregoing devices can communicate and interact with a network device such as a base station.

Figure 3:
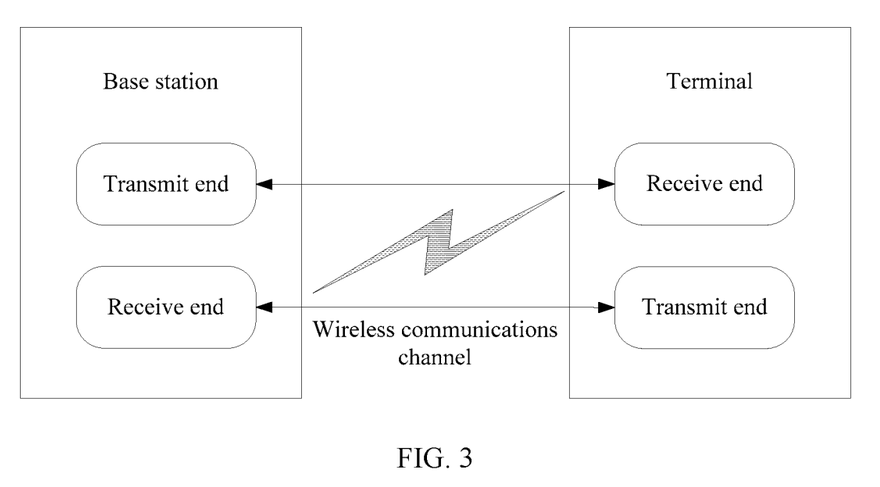
FIG. 3 is a diagram of a system architecture on which a polar code encoding and decoding method according to the present invention is based.

For easy understanding of the embodiments of the present invention, the following first describes a network architecture of a transmit end and a receive end on which the embodiments of the present invention are based. Referring to FIG. 3, FIG. 3 is a diagram of a system architecture on which a polar code encoding and decoding method in the present invention is based. In the embodiments of the present invention, the encoding and decoding method may be executed by a base station or a terminal in a communications system, and both the base station and the terminal include the transmit end and the receive end that are used in the present invention. The transmit end is configured to encode a target information sequence, and the receive end is configured to decode an encoded target information sequence. It can be understood that, in the present invention, when the transmit end is a base station, the receive end may be a terminal; or when the transmit end is a terminal, the receive end may be a base station. It should be noted that, the system architecture in the embodiments of the present invention includes but is not limited to the foregoing system architecture, and all system architectures that can implement polar code encoding and decoding shall fall within the protection scope of the present invention.

Figure 4:
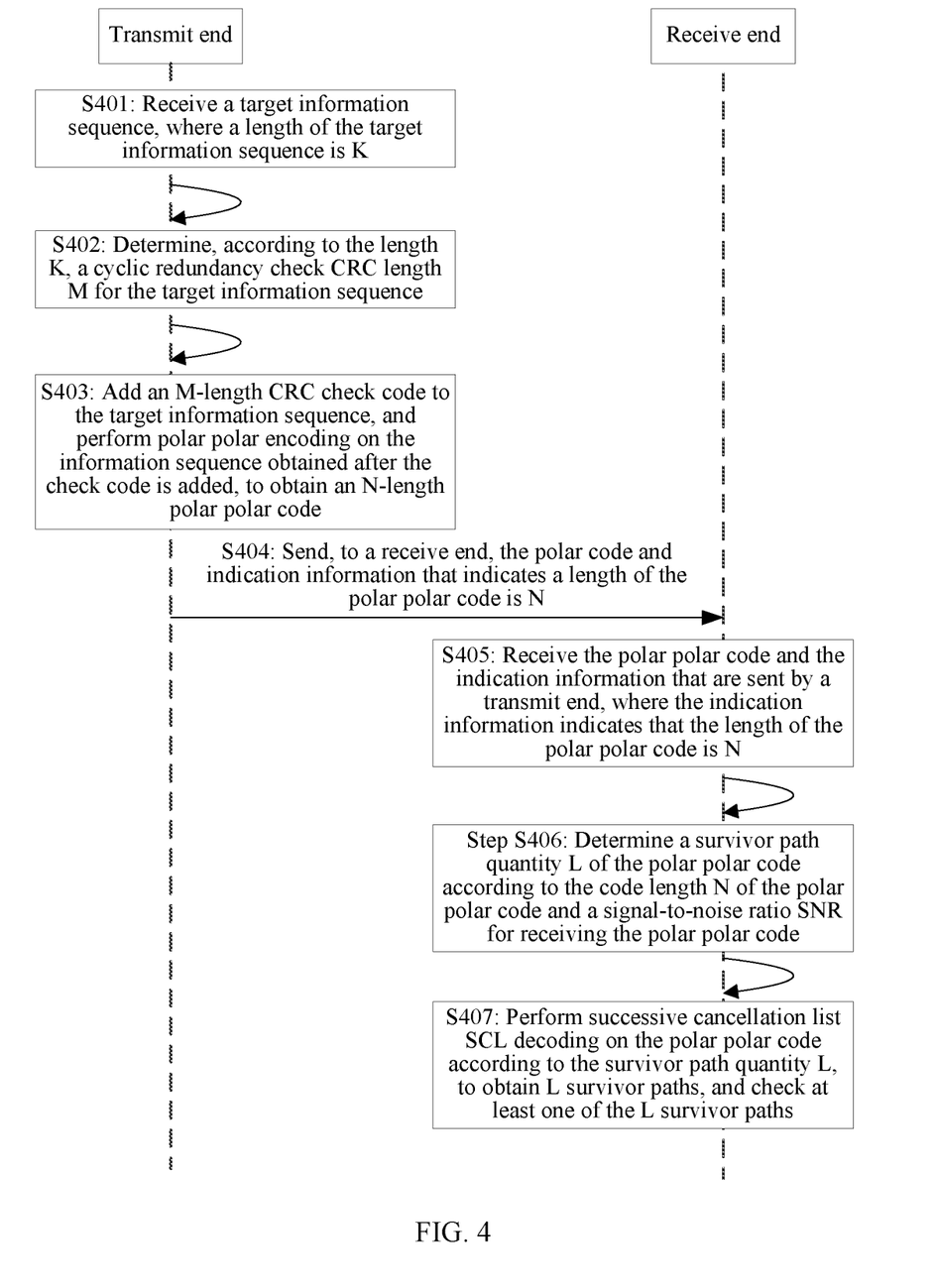
FIG. 4 is a schematic flowchart of a polar polar code encoding and decoding method according to the present invention.

Referring to FIG. 4, FIG. 4 is a schematic flowchart of a polar polar code encoding and decoding method in an embodiment of the present invention. The following describes the method from a perspective of an interactive side for a transmit end and a receive end of a base station or a terminal with reference to FIG. 4. As shown in FIG. 4, the method may include the following steps S401 to S407.

Step S401: Receive a target information sequence.

Specifically, the transmit end of the base station or the terminal (such as UE, User Equipment) obtains or collects the target information sequence (such as a sampled and quantized speech signal). A length of the target information sequence is K, and K is a positive integer. A value of K is usually 2 to the power of n, and n is a positive integer. For example, the value of K may be 128, 256, 512, 1024, or 2048.

Step S402: Determine, according to the length K, a cyclic redundancy check CRC length M for the target information sequence.

Specifically, in the prior art, lengths M of CRC check codes that are set by a same transmit end for different information sequences are the same; therefore, M is set to a same value regardless of the value of the length K of the target information sequence. However, a larger value of M means higher encoding complexity. When the length K of the target information sequence is relatively short but the length M is relatively long, obviously, encoding complexity is unnecessarily increased, and good encoding performance cannot be achieved. Therefore, this embodiment of the present invention provides a method for determining, according to the length K of the target information sequence, the cyclic redundancy check CRC length M for the target information sequence received in step S401. A rule to follow may be as follows: A longer length K of the target information sequence is corresponding to a larger M value of a CRC check code, and a shorter length K of the target information sequence is corresponding to a smaller M value of a CRC check code; or an M value of a CRC check code corresponding to a length K that is of the target information sequence and that is in a first range is greater than an M value of a CRC check code corresponding to a length K that is of the target information sequence and that is in a second range; and a value of K in the first range is greater than a value of K in the second range.

In a possible implementation, the transmit end determines, according to a pre-stored check code mapping relationship between the length K of the information sequence and the CRC check code length M, the CRC check code length M corresponding to the target information sequence. In the check code mapping relationship, a CRC check code length M corresponding to an information sequence with a longer length K is greater than or equal to a CRC check code length M corresponding to an information sequence with a shorter length K. It can be understood that, the mapping relationship may be a list relationship, or may be a function relationship. This is not specifically limited in the present invention. It can be understood that, the mapping relationship may be set according to a historical empirical value or related data from an emulation solution that achieves good polar code encoding and decoding performance.

Step S403: Add an M-length CRC check code to the target information sequence, and perform polar encoding on an information sequence obtained after the check code is added, to obtain an N-length polar code.

Specifically, the M-bit check code is appended to the end of the K-bit target information sequence (generally, a value of M may be 8, 16, 24, 32, or the like), and then polar encoding is performed on an information sequence obtained after the check code is added, to obtain the N-length polar code. Generally, a value of N is determined according to a length of a sampled and quantized signal, the value of N is usually 2 to the power of n, and n is a positive integer. Generally, a common value of N may be 128, 256, 512, 1024, 2048, or the like.

Step S404: Send, to the receive end, the polar code and indication information that indicates a length of the polar code is N.

Specifically, the polar code and the indication information that indicates the length of the polar code is N are sent to the receive end. The indication information may be the length N of the polar code, or may be related information such as the length K of the target information sequence and a bit rate of the polar code (in channel coding, an information sequence of K symbols is mapped to a codeword of N symbols through encoding, and K/N is referred to as a bit rate, where it is assumed that a symbol table keeps unchanged after encoding), so that the receive end can learn, according to the indication information, that the code length of the received polar code is N.

Step S405: The receive end receives the polar polar code and the indication information that are sent by the transmit end, where the indication information indicates that the length of the polar code is N.

Specifically, the receive end of the base station or the UE receives the polar polar code and the indication information that are sent by the transmit end in step S404, where the indication information indicates that the length of the polar code is N; and learns, according to the indication information, that the length of the polar polar code is N. With reference to the foregoing description, it can be learned that, the receive end may directly obtain the length N of the polar code according to the indication information (for example, the indication information directly includes the value of the length N of the polar code), or may learn of the length N of the polar code through calculation (for example, the indication information includes the length K of the target information sequence and the bit rate of the polar code, and the value of the length N of the polar code may be calculated according to the length K of the target information sequence and the bit rate of the polar code).

Step S406: Determine a survivor path quantity L of the polar code according to the code length N of the polar code and a signal-to-noise ratio SNR for receiving the polar code.

Specifically, in the prior art, a same receive end sets a relatively large survivor path quantity L for all received polar codes with different lengths N; therefore, a same relatively large value of L is used regardless of values of lengths N of the received polar codes. However, a larger value of L means higher decoding complexity and higher energy consumption. When the length N of the polar code is relatively small but a value of L is relatively large, obviously, the decoding complexity is unnecessarily increased, and good decoding performance cannot be achieved. Therefore, this embodiment of the present invention provides a method for determining the survivor path quantity L of the polar code according to the code length N of the polar code and the signal-to-noise ratio SNR for receiving the polar code. L is a positive integer, the value of L is generally 2 to the power of n, and n is a positive integer. Generally, a common value of L may be 2, 4, 8, 16, 32, or the like. The signal-to-noise ratio may reflect quality of a received signal (the polar polar code). Therefore, a larger signal-to-noise ratio means smaller noise interference and better signal quality, and fewer survivor paths need to be reserved; a smaller signal-to-noise ratio means larger noise interference and worse signal quality, and more survivor paths need to be reserved because of more uncertain factors in this case. Similarly, a longer polar code means higher decoding complexity and more uncertain factors, and more survivor paths need to be reserved. On the contrary, a shorter polar code means lower decoding complexity and fewer uncertain factors, and fewer survivor paths need to be reserved. That is, in this embodiment of the present invention, a relationship between the code length N, the signal-to-noise ratio SNR, and the survivor path quantity L can be dynamically set according to this rule. It should be noted that, a method for calculating the signal-to-noise ratio for receiving the polar polar code may be calculated according to a related parameter and a calculation formula in the prior art (for example, the logarithm of a ratio of a power for receiving the polar polar code to a power of noise to the base 10). This is not specifically limited in the present invention.

In a possible implementation, the receive end determines, according to a pre-stored survivor path quantity mapping relationship between the signal-to-noise ratio SNR, the code length N of the polar code, and the survivor path quantity L, the survivor path quantity L corresponding to the polar polar code. In the survivor path quantity mapping relationship, a value of L corresponding to a polar code with a larger signal-to-noise ratio SNR for receiving the polar polar code is less than or equal to a value of L corresponding to a polar code with a smaller signal-to-noise ratio SNR for receiving the polar polar code, and a value of L corresponding to a polar code with a longer code length is greater than or equal to a value of L corresponding to a polar code with a shorter code length. It can be understood that, the mapping relationship may be a list relationship, or may be a function relationship. This is not specifically limited in the present invention.

Step S407: Perform successive cancellation list SCL decoding on the polar polar code according to the survivor path quantity L, to obtain L survivor paths, and check at least one of the L survivor paths, to obtain a decoding result of the polar polar code.

Specifically, successive cancellation list SCL decoding (the decoding algorithm has been described in the Background) is performed on the polar polar code according to the survivor path quantity L determined in step S406, to obtain the L survivor paths, and the at least one of the L survivor paths is checked to obtain the decoding result of the polar polar code. It can be understood that, a specific checking manner depends on a specific manner of adding the check code before the transmit end transmits the polar polar code.

In a possible implementation, the receive end performs a cyclic redundancy CRC check on the at least one of the L survivor paths. Further, the receive end performs the CRC check on a survivor path with a largest probability value in the L survivor paths; and if the check succeeds, uses the survivor path with the largest probability value as the decoding result of the polar polar code. Still further, if the check fails, the transmit end is notified to perform retransmission; or if the check fails, the value of L is increased within a threshold range of L (because the value of L cannot be greater than a total path quantity, the value of L is within a specific range), and SCL decoding is performed on the polar polar code according to an increased value of L, to obtain the decoding result of the polar polar code. That is, after the value of L is increased, a possibly missed decoding result of the polar code can be obtained from an added survivor path, so that a probability of finally obtaining the decoding result is increased. A manner of increasing the value of L may be: increasing the value of L by u, where u is a positive integer, or multiplying L by v, where v is greater than 1.

In a possible implementation, the receive end performs the cyclic redundancy CRC check on w survivor paths in the L survivor paths, where w is an integer greater than 1 and less than or equal to L; and if the check succeeds on a survivor path in the w survivor paths, uses, as the decoding result of the polar polar code, a survivor path with a largest probability value in the survivor path on which the check succeeds. How the w survivor paths are chosen may be as follows: w survivor paths with relatively large probability values are chosen according to the probability values; or w survivor paths are randomly chosen; or w survivor paths are chosen according to a preset rule. This is not specifically limited in the present invention. Further, if the check succeeds on none of the w survivor paths, the transmit end is notified to perform retransmission; or if the check succeeds on none of the w survivor paths, the value of L is increased within a threshold range of L, and SCL decoding is performed on the polar polar code according to an increased value of L, to obtain the decoding result of the polar polar code. That is, after the value of L is increased, a possibly missed decoding result of the polar code can be obtained from an added survivor path, so that a probability of finally obtaining the decoding result is increased. A manner of increasing the value of L may be: increasing the value of L by u, where u is a positive integer, or multiplying L by v, where v is greater than 1.

In this embodiment of the present invention, the receive end receives the polar polar code and the indication information that are sent by the transmit end, where the indication information indicates that the length of the polar polar code is N; determines the survivor path quantity L of the polar polar code according to the code length N of the polar polar code and the signal-to-noise ratio SNR for receiving the polar polar code; performs successive cancellation list SCL decoding on the polar polar code according to the survivor path quantity L, to obtain the L survivor paths; and finally, checks the at least one of the L survivor paths, to obtain the decoding result of the polar polar code. That is, according to the polar code decoding method provided in the present invention, the survivor path quantity L for polar code decoding is adaptively chosen according to the code length of the polar polar code and the signal-to-noise ratio for receiving the polar polar code. In this way, a relatively small value of the survivor paths can be chosen without affecting performance. This reduces system complexity, and addresses a prior-art disadvantage that decoding may be rather complex because polar polar code decoding is performed only according to a fixed survivor path quantity. Further, in this embodiment of the present invention, the CRC check code length M is adaptively determined at the transmit end according to the length K of the to-be-transmitted target information sequence. This avoids a problem that encoding is excessively complex or excessively simple because the value of M of the CRC check code is too large or too small in some cases, and improves performance of polar polar code encoding.

In a specific application scenario, a specific processing process of the transmit end and the receive end in this embodiment of the present invention may be as follows.

(1) The transmit end obtains a K-length information sequence X.

(2) The transmit end determines a CRC length M according to a length K of the information sequence X. A value of the CRC length M may be 8, 16, 24, or 32. Generally, the value of M is determined according to the length K of the information sequence X. If the information sequence X is relatively short, CRC with a length of 8 may be used; or if the information sequence X is relatively long, CRC with a length of 32 may be used, or CRC with a length of 16 or 24 is used. Specifically, a correspondence is listed in the following table.

| | K | | | |
|---|---|---|---|---|
| | K ≤ 128 | 128 < K ≤ 512 | 512 < K ≤ 8192 | K > 8192 |
| M | 8 | 16 | 24 | 32 |

(3) The transmit end adds an M-length CRC check code to the K-length information sequence X, and obtains a (K+M)-length information sequence Y.

(4) The transmit end performs polar encoding on the information sequence Y, to obtain an N-length polar code sequence, where N is a code length of a polar code.

(5) The transmit end sends the code sequence obtained through polar encoding to the receive end by using a wireless spatial channel; and sends related information, such as the length K of the information sequence X and a bit rate of the Polar code, to the receive end.

(6) The receive end receives the information transmitted by the transmit end, such as the polar code sequence, the length K of the information sequence X, and the bit rate of the polar code.

(7) The receive end determines a code length N of the polar code and the CRC length M according to the length K of the information sequence X, the bit rate of the polar code, and the like.

Figure 5:
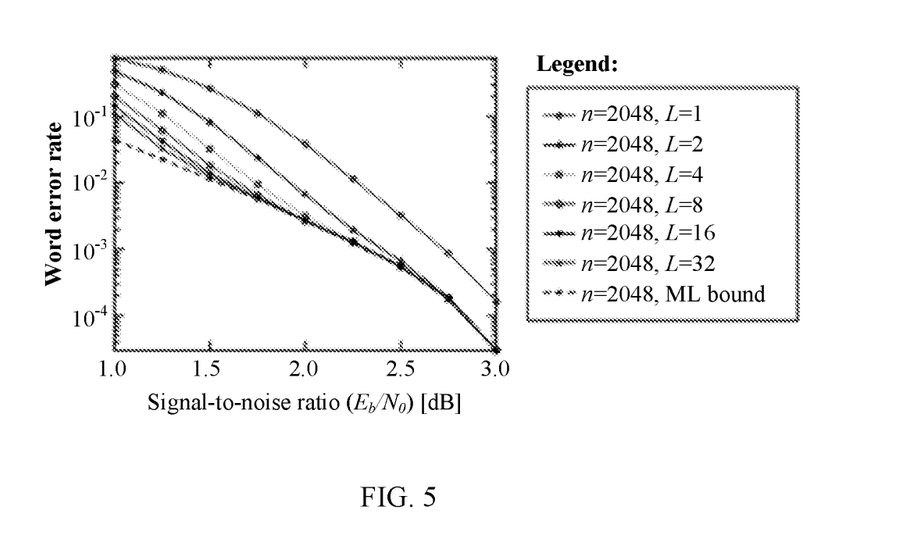
FIG. 5 is a performance curve of polar code encoding according to the present invention in the case of different values of L.

(8) The receive end calculates a signal-to-noise ratio SNR for receiving a signal, and obtains a value of a survivor path quantity L for polar encoding. Specifically, the value of the survivor path quantity L may be obtained according to a relationship between the signal-to-ratio SNR for receiving the signal, the code length N of the polar code, and the survivor path quantity L. The relationship may be represented by a table, a function, or the like, and may be stored at the receive end. FIG. 5 shows a performance curve for different values of L when the code length N is 8192.

A horizontal axis represents the signal-to-noise ratio SNR (Signal-to-Noise Ratio), and the vertical axis represents a bit error rate. According to the emulation result, the relationship between the signal-to-noise ratio SNR, the code length N of the polar code, and the survivor paths L may be determined, as listed in the following table.

| | SNR | | | | |
|---|---|---|---|---|---|
| N | ≤1.1 | 1.1~1.25 | 1.25~1.4 | 1.4~1.8 | ≥1.8 |
| | | | L | | |
| 8192 | 32 | 16 | 8 | 4 | 2 |

That is, when the code length is 8192: if SNR≤1.1 dB, the value of L is 32; if the SNR ranges from 1.1 to 2.5 dB, the value of L is 16; if the SNR ranges from 1.25 to 1.4 dB, the value of L is 8; if the SNR ranges from 1.4 to 1.8 dB, the value of L is 4; and if SNR≥1.8 dB, the value of L is 2.

(9) The receive end performs polar code decoding on the received information sequence according to the survivor path quantity L, to obtain L survivor paths.

(10) The receive end outputs a path with a largest probability in the L survivor paths, and performs a CRC check.

(11) If the CRC check succeeds, the path is a decoding result, or if the CRC check fails, the receive end notifies the transmit end to perform retransmission.

In another application scenario, steps (10) and (11) in the foregoing application scenario may be performed in a manner described in the following step (12) and step (13).

(12) The receive end performs an M-length CRC check on the L survivor paths; and if the CRC check succeeds on a survivor path, outputs a survivor path with a largest probability in the survivor path on which the CRC check succeeds; otherwise, step (13) is performed.

(13) The receive end adjusts the value of L to be a next-level value of L according to the relationship between the signal-to-noise ratio SNR for receiving the signal, the code length N of the polar code, and the survivor paths L. For example, in Table 1, if a current value of L is 4, the value of L is adjusted to be a next-level value 8 of L; if a current value of L is 16, the value of L is adjusted to be a next-level value 32 of L; if a value of L is a largest value of L, no adjustment is performed. As listed in Table 1, if a current value of L is 32, the largest value of L, no adjustment is performed, and a path with a largest probability in the L survivor paths is output; otherwise, step (9) is performed according to an adjusted value of L.

In still another application scenario, steps (10) and (11) in the foregoing application scenario may be performed in a manner described in the following steps (14) to (16).

(14) The receive end outputs a path with a largest probability in the L survivor paths.

(15) The receive end performs the CRC check on the path output in (14), and if the CRC check succeeds, the process ends; or if the CRC check fails, step (16) is performed.

(16) The receive end adjusts the value of L to be a next-level value of L according to the relationship between the signal-to-noise ratio SNR for receiving the signal, the code length N of the polar code, and the survivor paths L. For example, in Table 1, if a current value of L is 4, the value of L is adjusted to be a next-level value 8 of L; if a current value of L is 16, the value of L is adjusted to be a next-level value 32 of L; if a value of L is a largest value of L, no adjustment is performed. As listed in Table 1, if a current value of L is 32, the largest value of L, no adjustment is performed, and a path with a largest probability in the L survivor paths is output; otherwise, step (4) is performed according to an adjusted value of L. It can be understood that, the present invention includes but is not limited to the foregoing specific application scenarios. For more implementation details, refer to the method embodiment in FIG. 4. Details are not listed herein again.

Figure 6:
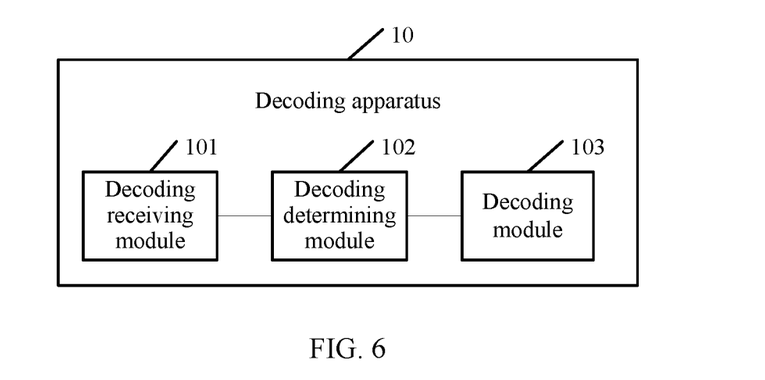
FIG. 6 is a schematic structural diagram of an embodiment of a decoding apparatus according to the present invention.

FIG. 6 is a schematic structural diagram of an embodiment of a decoding apparatus in the embodiments of the present invention. Details are described below. The decoding apparatus 10 may include: a decoding receiving module 101, a decoding determining module 102, and a decoding module 103.

The decoding receiving module 101 is configured to receive a polar polar code and indication information that are sent by a transmit end, where the indication information indicates that a length of the polar polar code is N.

The decoding determining module 102 is configured to determine a survivor path quantity L of the polar polar code according to the code length N of the polar polar code and a signal-to-noise ratio SNR for receiving the polar polar code, where L is a positive integer.

The decoding module 103 is configured to: perform successive cancellation list SCL decoding on the polar polar code according to the survivor path quantity L, to obtain L survivor paths; and check at least one of the L survivor paths, to obtain a decoding result of the polar polar code.

Specifically, the decoding determining module 102 is configured to: determine, according to a pre-stored survivor path quantity mapping relationship between the signal-to-noise ratio SNR, the code length N of the polar code, and the survivor path quantity L, the survivor path quantity L corresponding to the polar polar code. In the survivor path quantity mapping relationship, a value of L corresponding to a polar code with a larger signal-to-noise ratio SNR for receiving the polar polar code is less than or equal to a value of L corresponding to a polar code with a smaller signal-to-noise ratio SNR for receiving the polar polar code, and a value of L corresponding to a polar code with a longer code length is greater than or equal to a value of L corresponding to a polar code with a shorter code length.

Further, the decoding module 103 is specifically configured to: perform a cyclic redundancy CRC check on the at least one of the L survivor paths.

Further, the decoding module 103 may include: a first checking unit and a first decoding unit.

The first checking unit is configured to perform the CRC check on a survivor path with a largest probability value in the L survivor paths.

The first decoding unit is configured to: if the check succeeds, use the survivor path with the largest probability value as the decoding result of the polar polar code.

Further, the decoding module 103 may include a second decoding unit.

The second decoding unit is configured to: if the check fails, increase a value of L within a threshold range of L, and perform SCL decoding on the polar polar code according to an increased value of L, to obtain the decoding result of the polar polar code.

Still further, the decoding module 103 may include: a second checking unit and a third decoding unit.

The second checking unit is configured to perform the cyclic redundancy CRC check on w survivor paths in the L survivor paths, where w is an integer greater than 1 and less than or equal to L.

The third decoding unit is configured to: if the check succeeds on a survivor path in the w survivor paths, use, as the decoding result of the polar polar code, a survivor path with a largest probability value in the survivor path on which the check succeeds.

Still further, the decoding module 103 may include a fourth decoding unit.

The fourth decoding unit is configured to: if the check succeeds on none of the w survivor paths, increase a value of L within a threshold range of L, and perform SCL decoding on the polar polar code according to an increased value of L, to obtain the decoding result of the polar polar code.

Still further, that the second decoding unit or the fourth decoding unit increases a value of L is specifically:

increasing the value of L by u, where u is a positive integer, or multiplying L by v, where v is greater than 1.

It can be understood that, for functions of modules in the decoding apparatus 10, reference may be correspondingly made to specific implementations in the method embodiments in FIG. 4. Details are not described herein again.

Figure 7:
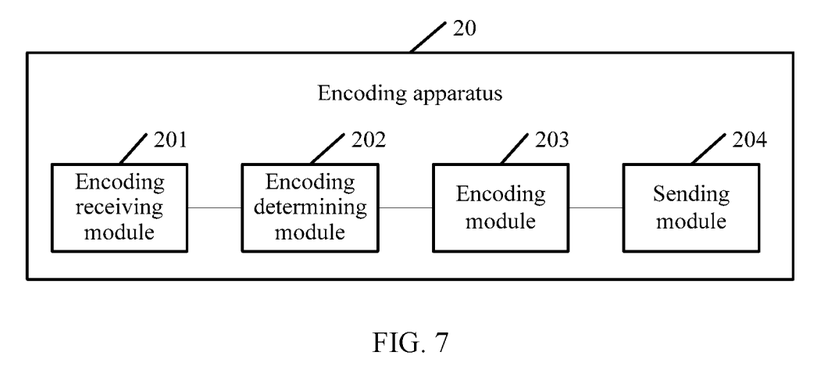
FIG. 7 is a schematic structural diagram of another embodiment of an encoding apparatus according to the present invention.

FIG. 7 is a schematic structural diagram of an embodiment of an encoding apparatus in the embodiments of the present invention. Details are described below. The encoding apparatus 20 may include: an encoding receiving module 201, an encoding determining module 202, an encoding module 203, and a sending module 204.

The encoding receiving module 201 is configured to receive a target information sequence, where a length of the target information sequence is K.

The encoding determining module 202 is configured to determine, according to the length K, a cyclic redundancy check CRC length M for the target information sequence.

The encoding module 203 is configured to add an M-length CRC check code to the target information sequence, and perform polar encoding on an information sequence obtained after the check code is added, to obtain an N-length polar code.

The sending module 204 is configured to send, to a receive end, the polar polar code and indication information that indicates a length of the polar polar code is N.

Specifically, the encoding determining module 202 is configured to:

determine, according to a pre-stored check code mapping relationship between the length K of the information sequence and the CRC check code length M, the CRC check code length M corresponding to the target information sequence, where in the check code mapping relationship, a CRC check code length M corresponding to an information sequence with a longer length K is greater than or equal to a CRC check code length M corresponding to an information sequence with a shorter length K.

It can be understood that, for functions of modules in the encoding apparatus 20, reference may be correspondingly made to specific implementations in the method embodiments in FIG. 4. Details are not described herein again.

To better implement the foregoing solutions in the embodiments of the present invention, the present invention further provides a related encoder and a related decoder that are configured to help implement the foregoing solutions. The following describes the encoder and the decoder in detail with reference to schematic structural diagrams of embodiments of an encoder and a decoder in the present invention in FIG. 8 and FIG. 9.

Figure 8:
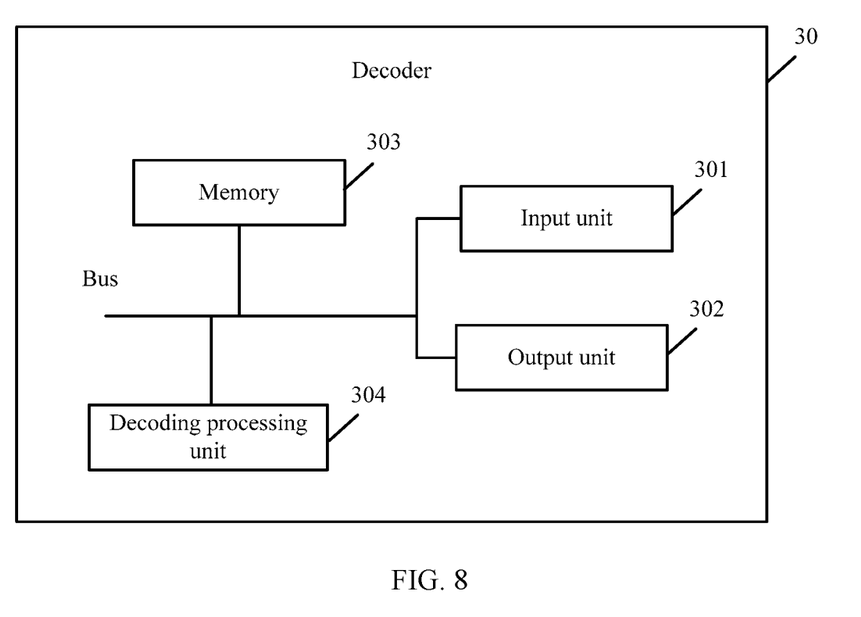
FIG. 8 is a schematic structural diagram of an embodiment of a decoder according to the present invention.

FIG. 8 is the schematic structural diagram of the decoder in the present invention. The decoder 30 in FIG. 8 may be configured to implement steps and methods in the method embodiments. The decoder 30 may be applied to base stations or terminals in various communications systems. In the embodiment shown in FIG. 8, the decoder 30 includes an input unit 301, an output unit 302, a storage unit 303, and a decoding processing unit 304. The decoding processing unit 304 controls an operation of the decoder 30, and may be configured to process a signal. The storage unit 303 may include a read-only memory and a random access memory, and provides an instruction and data to the decoding processing unit 304. A part of the storage unit 303 may further include a non-volatile random access memory (NVRAM). In specific application, the decoder 30 may be built in or be a wireless communications device such as a mobile phone, and may further include a carrier that accommodates the input unit 301 and the output unit 302, so that the decoder 30 is allowed to receive data from and transmit data to a remote location. The input unit 301 and the output unit 302 may be coupled to an antenna, to transmit and receive signals. Components in the decoder 30 are coupled together by using a bus system. In addition to a data bus, the bus system further includes a power bus, a control bus, and a status signal bus. However, for clear description, various buses are marked as the bus system in the diagram.

The storage unit 303 may store an instruction that enables the decoding processing unit 304 to perform the following process:

receiving a polar polar code and indication information that are sent by a transmit end, where the indication information indicates that a length of the polar polar code is N;

determining a survivor path quantity L of the polar polar code according to the code length N of the polar polar code and a signal-to-noise ratio SNR for receiving the polar polar code, where L is a positive integer; and performing successive cancellation list SCL decoding on the polar polar code according to the survivor path quantity L, to obtain L survivor paths, and checking at least one of the L survivor paths, to obtain a decoding result of the polar polar code.

Further, the storage unit 303 further stores an instruction that enables the decoding processing unit 304 to perform the following process: determining, according to a pre-stored survivor path quantity mapping relationship between the signal-to-noise ratio SNR, the code length N of the polar code, and the survivor path quantity L, the survivor path quantity L corresponding to the polar polar code, where in the survivor path quantity mapping relationship, a value of L corresponding to a polar code with a larger signal-to-noise ratio SNR for receiving the polar polar code is less than or equal to a value of L corresponding to a polar code with a smaller signal-to-noise ratio SNR for receiving the polar polar code, and a value of L corresponding to a polar code with a longer code length is greater than or equal to a value of L corresponding to a polar code with a shorter code length.

Still further, the storage unit 303 further stores an instruction that enables the decoding processing unit 304 to perform the following process: performing a cyclic redundancy CRC check on the at least one of the L survivor paths.

Still further, the storage unit 303 further stores an instruction that enables the decoding processing unit 304 to perform the following process: performing the CRC check on a survivor path with a largest probability value in the L survivor paths; and if the check succeeds, using the survivor path with the largest probability value as the decoding result of the polar polar code.

Still further, the storage unit 303 further stores an instruction that enables the decoding processing unit 304 to perform the following process: if the check fails, notifying the transmit end to perform retransmission; or if the check fails, increasing a value of L within a threshold range of L, and performing SCL decoding on the polar polar code according to an increased value of L, to obtain the decoding result of the polar polar code.

Still further, the storage unit 303 further stores an instruction that enables the decoding processing unit 304 to perform the following process: performing the cyclic redundancy CRC check on w survivor paths in the L survivor paths, where w is an integer greater than 1 and less than or equal to L; and if the check succeeds on a survivor path in the w survivor paths, using, as the decoding result of the polar polar code, a survivor path with a largest probability value in the survivor path on which the check succeeds.

Still further, the storage unit 303 further stores an instruction that enables the decoding processing unit 304 to perform the following process: if the check succeeds on none of the w survivor paths, notifying the transmit end to perform retransmission; or if the check succeeds on none of the w survivor paths, increasing a value of L within a threshold range of L, and performing SCL decoding on the polar polar code according to an increased value of L, to obtain the decoding result of the polar polar code.

Still further, the value of L is increased by u, where u is a positive integer, or L is multiplied by v, where v is greater than 1.

It can be understood that, for functions of functional units in the polar code decoder 30, reference may be correspondingly made to specific implementations in the method embodiments in FIG. 4. Details are not described herein again.

Figure 9:
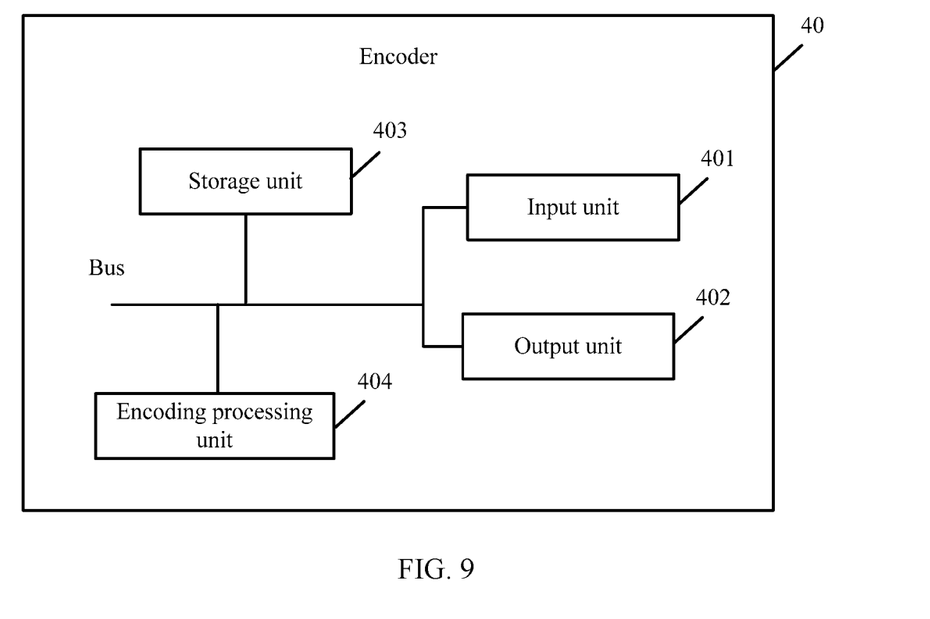
FIG. 9 is a schematic structural diagram of an embodiment of an encoder according to the present invention.

FIG. 9 is the schematic structural diagram of the encoder in the present invention. The encoder 40 in FIG. 9 may be configured to implement steps and methods in the method embodiments. The encoder 40 may be applied to base stations or terminals in various communications systems. In the embodiment shown in FIG. 9, the encoder 40 includes an input unit 401, an output unit 402, a storage unit 403, and an encoding processing unit 404. The encoding processing unit 404 controls an operation of the encoder 40, and may be configured to process a signal. The storage unit 403 may include a read-only memory and a random access memory, and provides an instruction and data to the encoding processing unit 404. A part of the storage unit 403 may further include a non-volatile random access memory (NVRAM). In specific application, the encoder 40 may be built in or be a wireless communications device such as a mobile phone, and may further include a carrier that accommodates the input unit 401 and the output unit 402, so that the encoder 40 is allowed to receive data from and transmit data to a remote location. The input unit 401 and the output unit 402 may be coupled to an antenna, to transmit and receive signals. Components in the encoder 40 are coupled together by using a bus system. In addition to a data bus, the bus system further includes a power bus, a control bus, and a status signal bus. However, for clear description, various buses are marked as the bus system in the diagram.

The storage unit 403 may store an instruction that enables the encoding processing unit 404 to perform the following process:

receiving a target information sequence, where a length of the target information sequence is K;

determining, according to the length K, a cyclic redundancy check CRC length M for the target information sequence;

adding an M-length CRC check code to the target information sequence, and performing polar encoding on an information sequence obtained after the check code is added, to obtain an N-length polar code; and sending, to a receive end, the polar polar code and indication information that indicates a length of the polar polar code is N.

Specifically, the storage unit 403 further stores an instruction that enables the encoding processing unit 404 to perform the following process:

determining, according to a pre-stored check code mapping relationship between the length K of the information sequence and the CRC check code length M, the CRC check code length M corresponding to the target information sequence, where in the check code mapping relationship, a CRC check code length M corresponding to an information sequence with a longer length K is greater than or equal to a CRC check code length M corresponding to an information sequence with a shorter length K.

It can be understood that, for functions of functional units in the encoder 40, reference may be correspondingly made to specific implementations in the method embodiments in FIG. 4. Details are not described herein again.

It should be noted that, in the foregoing encoder and decoder that are disclosed in the embodiments of the present invention, the decoding processing unit 304 or the encoding processing unit 404 may be an integrated circuit chip with a signal processing capability. During implementation, steps in the foregoing methods may be implemented by using a hardware integrated logic circuit in the decoding processing unit 304 or the encoding processing unit 404, or by using an instruction in a form of software. The instruction may alternatively be implemented and controlled by using another related processor, so as to execute the methods disclosed in the embodiments of the present invention. The decoding processing unit 304 or the encoding processing unit 404 may be a general purpose processor, a digital signal processor (DSP), an application-specific integrated circuit (ASIC), a field programmable gate array (FPGA), or another programmable logic device, a discrete gate or a transistor logic device, or a discrete hardware component, and may implement or execute methods, steps and logical block diagrams that are disclosed in the embodiments of the present invention.

Figure 10:
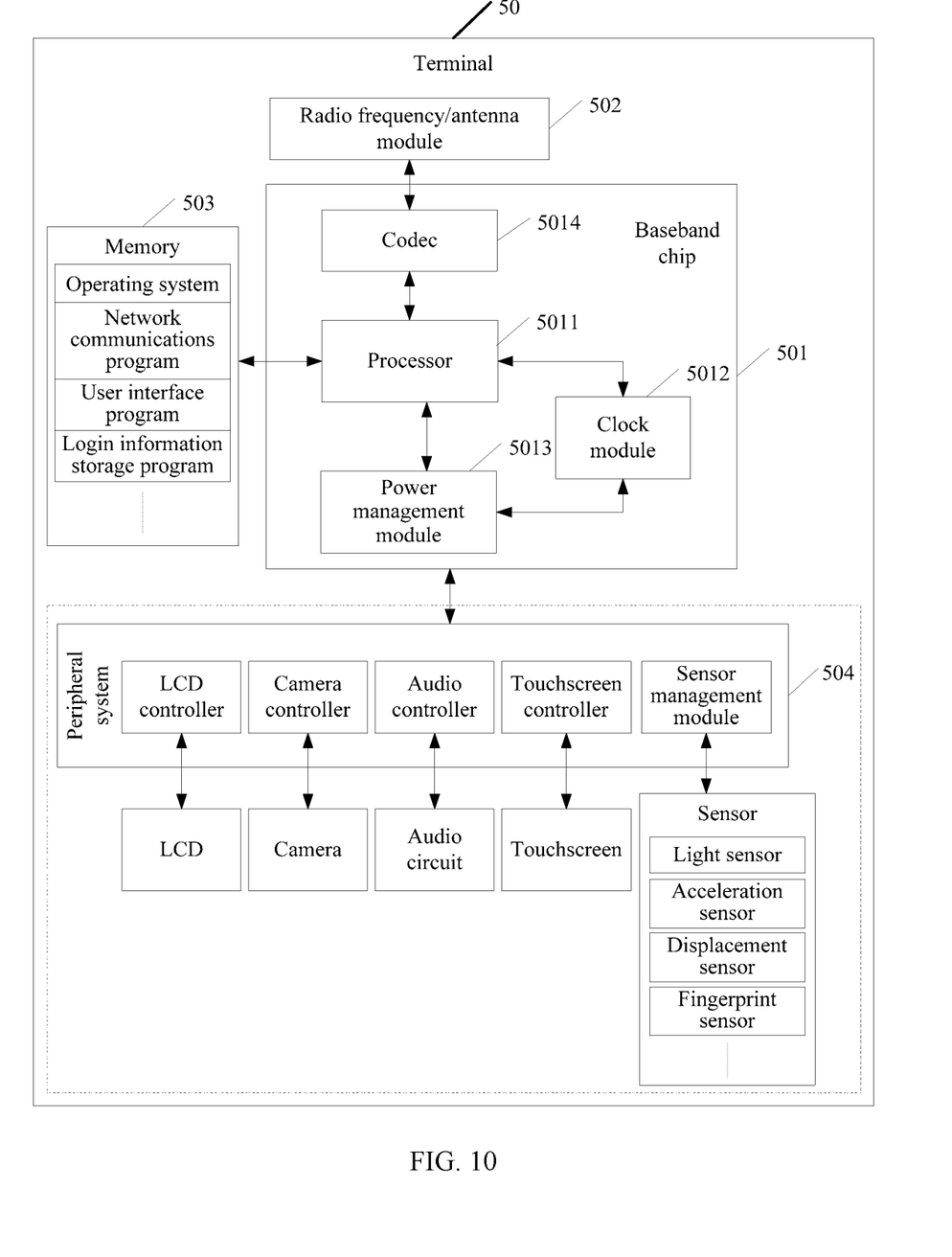
FIG. 10 is a schematic structural diagram of a terminal according to the present invention.

Referring to FIG. 10, FIG. 10 is a schematic structural diagram of a terminal 50 provided in the present invention. The decoder 30 and the encoder 40 in the embodiments of the present invention may be integrated into the terminal, to execute related polar polar code encoding and decoding method processes in the embodiments of the present invention. The terminal 50 includes: a baseband chip 501, a radio frequency/antenna module 502, a memory 503 (which may include one or more computer-readable storage media), and a peripheral system 504, such as a display (LCD), a camera, an audio circuit, a touchscreen, and a sensor (one or more sensors may be included). The baseband chip 501 may include, through integration, one or more processors 5011, a clock module 5012, a power management module 5013, and a codec 5014 (which is integrated with related functions of the decoder 30 and the encoder 40). These components may communicate over one or more communications buses.

The memory 503 is coupled with the processor 5011, and is configured to store various software programs and/or a plurality sets of instructions. During specific implementation, the memory 503 may include a high-speed random access memory, and may also include a non-volatile memory such as one or more disk storage devices, a flash device, or another non-volatile solid-state storage device.

The radio frequency/antenna module 502 is configured to receive and send a radio frequency signal. The radio frequency/antenna module 502 communicates with a communications network and another communications device by using a radio frequency signal or an antenna. During specific implementation, the radio frequency/antenna module 502 may include but is not limited to: an antenna system, an RF transceiver, one or more amplifiers, a tuner, one or more oscillators, a digital signal processor, a CODEC chip, a SIM card, a storage medium, and the like. In some embodiments, the radio frequency/antenna module 502 may be implemented on an independent chip.

The peripheral system 504 is mainly configured to implement an interaction function between the terminal 50 and a user/external environment, and mainly includes an input/output apparatus of the client 50. During specific implementation, the peripheral system 504 may include: a display (LCD) controller, a camera controller, an audio controller, a touchscreen controller, and a sensor management module. Each controller may be coupled with a corresponding peripheral device. In some embodiments, the peripheral system 504 may further include another I/O peripheral controller.

The clock module 5012 that is integrated into the baseband chip 501 is mainly configured to generate a clock required for data transmission and timing control for the processor 5011. The power management module 5013 that is integrated into the baseband chip 501 is mainly configured to provide a stable and high-precision voltage for the processor 5011, the radio frequency module 502, and the peripheral system.

It can be understood that, for functions performed by the codec 5014 in the baseband chip, reference may be correspondingly made to method steps in the method embodiments in FIG. 4. Details are not described herein again.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual requirements to achieve the objectives of the solutions of the embodiments.

In addition, functional units in the embodiments of the present invention may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of the present invention essentially, or the part contributing to the prior art, or some of the technical solutions may be implemented in a form of a software product. The computer software product is stored in a storage medium, and includes several instructions for instructing a computer device (which may be a personal computer, a server, a network device, or the like) to perform all or some of the steps of the methods described in the embodiments of the present invention. The foregoing storage medium includes: any medium that can store program code, such as a USB flash drive, a removable hard disk, a read-only memory (ROM, Read-Only Memory), a random access memory (RAM, Random Access Memory), a magnetic disk, or an optical disc.

The foregoing descriptions are merely specific implementations of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A polar code decoding method, comprising:
    obtaining a polar code and a code length N of the polar code;
    determining a survivor path quantity L of the polar code according to the code length N of the polar code and a signal-to-noise ratio (SNR) for receiving the polar code, wherein L is a positive integer;
    performing successive cancellation list (SCL) decoding on the polar code according to the survivor path quantity L, to obtain L survivor paths; and
    checking at least one of the L survivor paths, to obtain a decoding result of the polar code.

2. The method according to claim 1, wherein the determining the survivor path quantity L of the polar code according to the code length N of the polar code and the SNR for receiving the polar code comprises:
    determining, according to a pre-stored survivor path quantity mapping relationship between the SNR, the code length N of the polar code, and the survivor path quantity L, the survivor path quantity L corresponding to the polar code, wherein in the survivor path quantity mapping relationship, a value of L corresponding to a polar code with a larger SNR for receiving the polar code is less than or equal to a value of L corresponding to a polar code with a smaller SNR for receiving the polar code, and a value of L corresponding to a polar code with a longer code length is greater than or equal to a value of L corresponding to a polar code with a shorter code length.

3. The method according to claim 1, wherein the checking at least one of the L survivor paths comprises:
    performing a cyclic redundancy (CRC) check on the at least one of the L survivor paths.

4. The method according to claim 3, wherein the performing the CRC check on the at least one of the L survivor paths comprises:
    performing the CRC check on a survivor path with a largest probability value in the L survivor paths; and
    if the CRC check succeeds, using the survivor path with the largest probability value as the decoding result of the polar code.

5. The method according to claim 4, wherein after the performing the CRC check on the survivor path with the largest probability value in the L survivor paths, the method further comprises:
    if the CRC check fails, increasing a value of L within a threshold range of L, and performing SCL decoding on the polar code according to an increased value of L, to obtain the decoding result of the polar code.

6. The method according to claim 5, wherein the increasing the value of L comprises one of the following operations:
    increasing the value of L by u, wherein u is a positive integer; or
    multiplying L by v, wherein v is greater than 1.

7. The method according to claim 3, wherein the performing the CRC check on the at least one of the L survivor paths comprises:
    performing the CRC check on w survivor paths in the L survivor paths, wherein w is an integer greater than 1 and less than or equal to L; and
    if the CRC check succeeds on a survivor path in the w survivor paths, using, as the decoding result of the polar code, a survivor path with a largest probability value in the survivor path on which the check succeeds.

8. The method according to claim 7, wherein after the performing the CRC check on the at least one of the L survivor paths, the method further comprises:
    if the CRC check succeeds on none of the w survivor paths, increasing a value of L within a threshold range of L, and performing SCL decoding on the polar code according to an increased value of L, to obtain the decoding result of the polar code.

9. A polar code encoding method, comprising:
    obtaining, by a transmit end, a target information sequence, wherein a length of the target information sequence is K;
    determining, according to the length K, a cyclic redundancy check (CRC) length M for the target information sequence;
    adding an M-length CRC check code to the target information sequence;
    performing polar encoding on the information sequence obtained after the check code is added, to obtain a polar code; and
    sending, to a receive end, the polar code.

10. The method according to claim 9, wherein the determining, according to the length K, the CRC length M for the target information sequence comprises:
    determining, according to a pre-stored check code mapping relationship between the length K of the information sequence and the CRC check code length M, the CRC check code length M corresponding to the target information sequence, wherein in the check code mapping relationship, a CRC check code length M corresponding to an information sequence with a longer length K is greater than or equal to a CRC check code length M corresponding to an information sequence with a shorter length K.

11. A decoding apparatus, comprising:
    a non-transitory memory storage comprising instructions; and
    one or more hardware processors in communication with the non-transitory memory storage, wherein the one or more hardware processors execute the instructions to:
        obtain a polar code and a code length N of the polar code;
        determine a survivor path quantity L of the polar code according to the code length N of the polar code and a signal-to-noise ratio (SNR) for receiving the polar code, wherein L is a positive integer;

perform successive cancellation list (SCL) decoding on the polar code according to the survivor path quantity L, to obtain L survivor paths; and check at least one of the L survivor paths, to obtain a decoding result of the polar code.

12. The apparatus according to claim 11, wherein the one or more hardware processors further execute the instructions to:

determine, according to a pre-stored survivor path quantity mapping relationship between the SNR, the code length N of the polar code, and the survivor path quantity L, the survivor path quantity L corresponding to the polar code, wherein in the survivor path quantity mapping relationship, a value of L corresponding to a polar code with a larger SNR for receiving the polar code is less than or equal to a value of L corresponding to a polar code with a smaller SNR for receiving the polar code, and a value of L corresponding to a polar code with a longer code length is greater than or equal to a value of L corresponding to a polar code with a shorter code length.

13. The apparatus according to claim 11, wherein the one or more hardware processors further execute the instructions to:

perform a cyclic redundancy (CRC) check on the at least one of the L survivor paths.

14. The apparatus according to claim 13, wherein the one or more hardware processors further execute the instructions to:

perform the CRC check on a survivor path with a largest probability value in the L survivor paths; and if the CRC check succeeds, use the survivor path with the largest probability value as the decoding result of the polar code.

15. The apparatus according to claim 14, wherein the one or more hardware processors further execute the instructions to:

if the CRC check fails, increase a value of L within a threshold range of L, and perform SCL decoding on the polar code according to an increased value of L, to obtain the decoding result of the polar code.

16. The apparatus according to claim 15, wherein the one or more hardware processors further execute the instructions to perform one of the following operations:

increasing the value of L by u, wherein u is a positive integer; or multiplying L by v, wherein v is greater than 1.

17. The apparatus according to claim 13, wherein the one or more hardware processors further execute the instructions to:

perform the CRC check on w survivor paths in the L survivor paths, wherein w is an integer greater than 1 and less than or equal to L; and if the CRC check succeeds on a survivor path in the w survivor paths, use, as the decoding result of the polar code, a survivor path with a largest probability value in the survivor path on which the check succeeds.

18. The apparatus according to claim 17, wherein the one or more hardware processors further execute the instructions to:

if the CRC check succeeds on none of the w survivor paths, increase a value of L within a threshold range of L, and perform SCL decoding on the polar code according to an increased value of L, to obtain the decoding result of the polar code.

19. An encoding apparatus, comprising:

a non-transitory memory storage comprising instructions; and one or more hardware processors in communication with the non-transitory memory storage, wherein the one or more hardware processors execute the instructions to:

obtain a target information sequence, wherein a length of the target information sequence is K;

determine, according to the length K, a cyclic redundancy check (CRC) length M for the target information sequence;

add an M-length CRC check code to the target information sequence;

perform polar encoding on an information sequence obtained after the check code is added, to obtain a polar code; and send, to a receive end, the polar code.

20. The apparatus according to claim 19, wherein the one or more hardware processors further execute the instructions to:

determine, according to a pre-stored check code mapping relationship between the length K of the information sequence and the CRC check code length M, the CRC check code length M corresponding to the target information sequence, wherein in the check code mapping relationship, a CRC check code length M corresponding to an information sequence with a longer length K is greater than or equal to a CRC check code length M corresponding to an information sequence with a shorter length K.

* * * * *